United States Patent
Kanzawa et al.

(10) Patent No.: US 8,855,589 B2
(45) Date of Patent: Oct. 7, 2014

(54) TUNER

(71) Applicant: Semiconductor Components Industries, LLC, Phoenix, AZ (US)

(72) Inventors: Tomoya Kanzawa, Gunma-ken (JP); Shinji Kurihara, Gunma-ken (JP); Katu Horikoshi, Gunma-ken (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 13/868,640

(22) Filed: Apr. 23, 2013

(65) Prior Publication Data

US 2013/0285714 A1    Oct. 31, 2013

(30) Foreign Application Priority Data

Apr. 23, 2012  (JP) ................. 2012-098023

(51) Int. Cl.
*H04B 1/18* (2006.01)
*H04B 1/16* (2006.01)

(52) U.S. Cl.
USPC ................... 455/192.1; 455/182.1

(58) Field of Classification Search
CPC ....................................... H03J 7/04
USPC .............. 455/182.1–182.2, 192.1–192.2
See application file for complete search history.

(56) References Cited

U.S. PATENT DOCUMENTS

| 2003/0017817 A1* | 1/2003 | Cowley ............... 455/323 |
| 2009/0111410 A1 | 4/2009 | Kobayashi |
| 2012/0220250 A1* | 8/2012 | Ochiai ............... 455/205 |

FOREIGN PATENT DOCUMENTS

| JP | 2002232251 A | 8/2002 |
| JP | 2009105727 A | 5/2009 |

OTHER PUBLICATIONS

Espacenet, Patent Abstract for Japanese Publication No. 2009105727 published May 14, 2009 (1 page).
Espacenet, Patent Abstract for Japanese Publication No. 2002232251 published Aug. 16, 2002 (1 page).

* cited by examiner

*Primary Examiner* — Lee Nguyen
(74) *Attorney, Agent, or Firm* — Patents on Demand, P.A.; Scott M. Garrett; Brian K. Buchheit

(57) ABSTRACT

A center frequency F0 of an IF filter is effectively adjusted. The IF filter filters a down-converted signal centering around the center frequency F0. A pseudo sine wave generation circuit generates a pseudo sine wave having a level change of at least two steps respectively on both positive and negative sides. The pseudo sine wave is made to pass through the IF filter by a switch circuit, and in the state, an F0 adjustment circuit adjusts the center frequency F0 in the IF filter 14 by comparing a phase of the pseudo sine wave with a phase of a signal after passing through the IF filter.

20 Claims, 6 Drawing Sheets

TUNER

FIELD OF THE INVENTION

The present disclosure relates to a tuner which down-converts an RF signal to an IF signal and performs signal processing.

BACKGROUND OF THE INVENTION

In a radio tuner or the like, by mixing a local signal separated by an intermediate frequency (IF) from a desired station frequency by a mixer with an RF signal for which an arriving radio wave is received by an antenna, the RF signal of a desired station is down-converted to an IF signal, and the obtained IF signal is filtered in an IF filter to take out a desired station signal.

Then, the IF filter is requested to appropriately take out the desired station signal. Thus, it is desired to accurately set a passing band of the IF filter, and a center frequency F0 of the IF filter is adjusted. Although a ceramic filter whose passing band is accurate is also used, it cannot be incorporated in an IC and is externally attached.

Conventionally, in F0 adjustment of the IF filter, an adjustment method utilizing a replica oscillation circuit is used. In the adjustment method, a replica circuit simulating an IF filter circuit in a tuner is oscillated and the oscillation frequency is counted by a frequency counter. Then, by adjusting the oscillation frequency of the replica oscillation circuit to be an F0 value and reflecting the adjustment result on the F0 adjustment of the IF filter, the IF filter is adjusted.

RELATED ART

Japanese Patent Laid-Open Publication No. 2009-105727

SUMMARY OF THE INVENTION

Problems to be Solved

In the above-described adjustment method of the IF filter, since the circuit simulating the IF filter is oscillated and adjustment is made on the basis of the oscillation frequency and an actual IF filter circuit is not utilized, an error tends to occur.

Also, the tuner is provided with an S meter circuit which detects a level of an output signals of the IF filter. For the S meter, a signal is inputted from the outside to a radio wave reception part of the tuner, and detection output of the S meter is adjusted such that an output result of the S meter at the time becomes a certain specific value. In such an adjustment method, there are problems of requiring an environment for external adjustment to be constructed and of increased man-hours due to the external adjustment.

Means for Solving the Problems

In the present invention, a tuner which down-converts an RF signal to an IF signal and performs signal processing includes an IF filter which filters the down-converted signal centering around a center frequency F0 to take out the IF signal, a pseudo sine wave generation circuit which generates a pseudo sine wave having a level change of at least two steps respectively on both positive and negative sides, a switch circuit which supplies the pseudo sine wave to the IF filter instead of the RF signal, and an F0 adjustment circuit which adjusts the center frequency F0 of the IF filter, and in the tuner, the pseudo sine wave is made to pass through the IF filter by the switch circuit, and in this state, the F0 adjustment circuit compares a phase of the pseudo sine wave with a phase of the signal after passing through the IF filter, thereby adjusting the center frequency F0 in the IF filter.

Further, preferably, an S meter which detects a signal level of output of the IF filter and an S meter adjustment circuit which adjusts output of the S meter are provided, the pseudo sine wave is made to pass through the IF filter by the switch circuit, and in this state, a detection level of the S meter is adjusted depending on a level of an output signal of the S meter circuit.

According to the present invention, by making a signal pass through the IF filter and performing adjustment work, adjustment accuracy may be improved. Also, by adjusting level detection of the S meter by an internally generated signal, dispersion of the S meter may be adjusted without input of an external signal.

DETAILED DESCRIPTION OF THE PREFERRED EMBODIMENT

Hereinafter, the embodiment of the present invention will be described on the basis of drawings.

Figure 1:
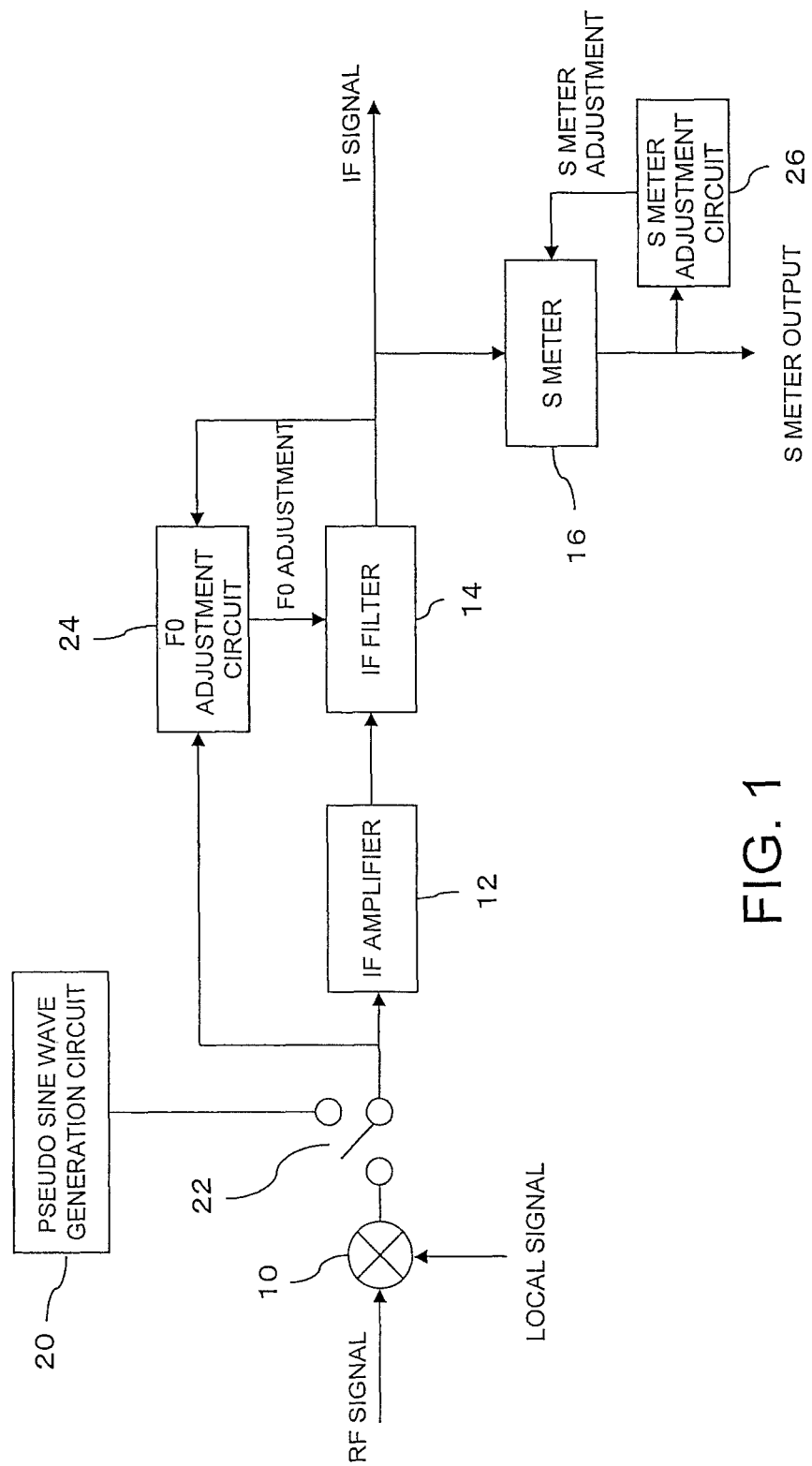
FIG. 1 is a block diagram illustrating a main section of a tuner.

FIG. 1 is a block diagram illustrating a main section of a tuner. An RF signal received by an antenna is supplied to a mixer 10. To the mixer 10, a local signal separated from a desired station signal by a frequency of an IF signal is supplied, and the IF signal before filtering, for which the desired station signal is down-converted to the frequency of the IF signal, is obtained. The IF signal is amplified as prescribed in an IF amplifier 12 and then supplied to an IF filter 14.

Then, in the IF filter 14, the desired station signal around the center frequency of the IF signals is extracted, and it is supplied to a subsequent stage, demodulated, and reproduced.

Also, the IF signal after filtering, which is output of the IF filter 14, is supplied to an S meter 16. The S meter detects a level of the IF signal after filtering, and outputs a detection result as S meter output. The S meter output indicates a reception strength level of the desired station signal, and is utilized in stereo/monaural switching control or the like.

In the present embodiment, a pseudo sine wave generation circuit 20 is provided, and a pseudo sine wave is generated there. Then, a switch 22 is provided between the IF amplifier 12 and the mixer 10. By switching the switch 22, output of the mixer 10 or the pseudo sine wave from the pseudo sine wave generation circuit 20 can be switched and inputted to the IF amplifier 12.

In the present embodiment, in the state that the switch 22 is switched and the pseudo sine wave is supplied to the IF amplifier 12, the center frequency F0 of the IF filter 14 is adjusted and a detection level of the S meter 16 is adjusted.

The IF signal after filtering, which is the output of the IF filter 14, is supplied to an F0 adjustment circuit 24. To the F0 adjustment circuit 24, the pseudo sine wave which is an input signal to the IF amplifier 12 is also supplied. The F0 adjustment circuit prepares an F0 adjustment signal for adjusting the center frequency F0 of the IF filter 14 from comparison between the IF signal after filtering and the pseudo sine wave. The F0 adjustment signal is supplied to the IF filter 14, and the bandpass center frequency F0 of the IF filter is adjusted.

Also, the S meter output is supplied to an S meter adjustment circuit 26 as well. Ideally, the S meter output would be a prescribed value determined beforehand when the pseudo sine wave is inputted, but an error is caused by variation. The S meter adjustment circuit 26 generates a signal for S meter adjustment. According to the signal for S meter adjustment, the detection level in the S meter 16 is adjusted. That is, the detection level of the S meter 16 is adjusted such that the S meter output when the pseudo sine wave is inputted becomes the prescribed value.

A circuit of the tuner in the present embodiment is built inside a semiconductor integrated circuit (IC or LSI). Thus, the IF filter 14 is not a ceramic filter, and requires adjustment for optimizing filtering characteristics. The IF filter 14 may be active or passive.

<Pseudo Sine Wave>

Figure 2:
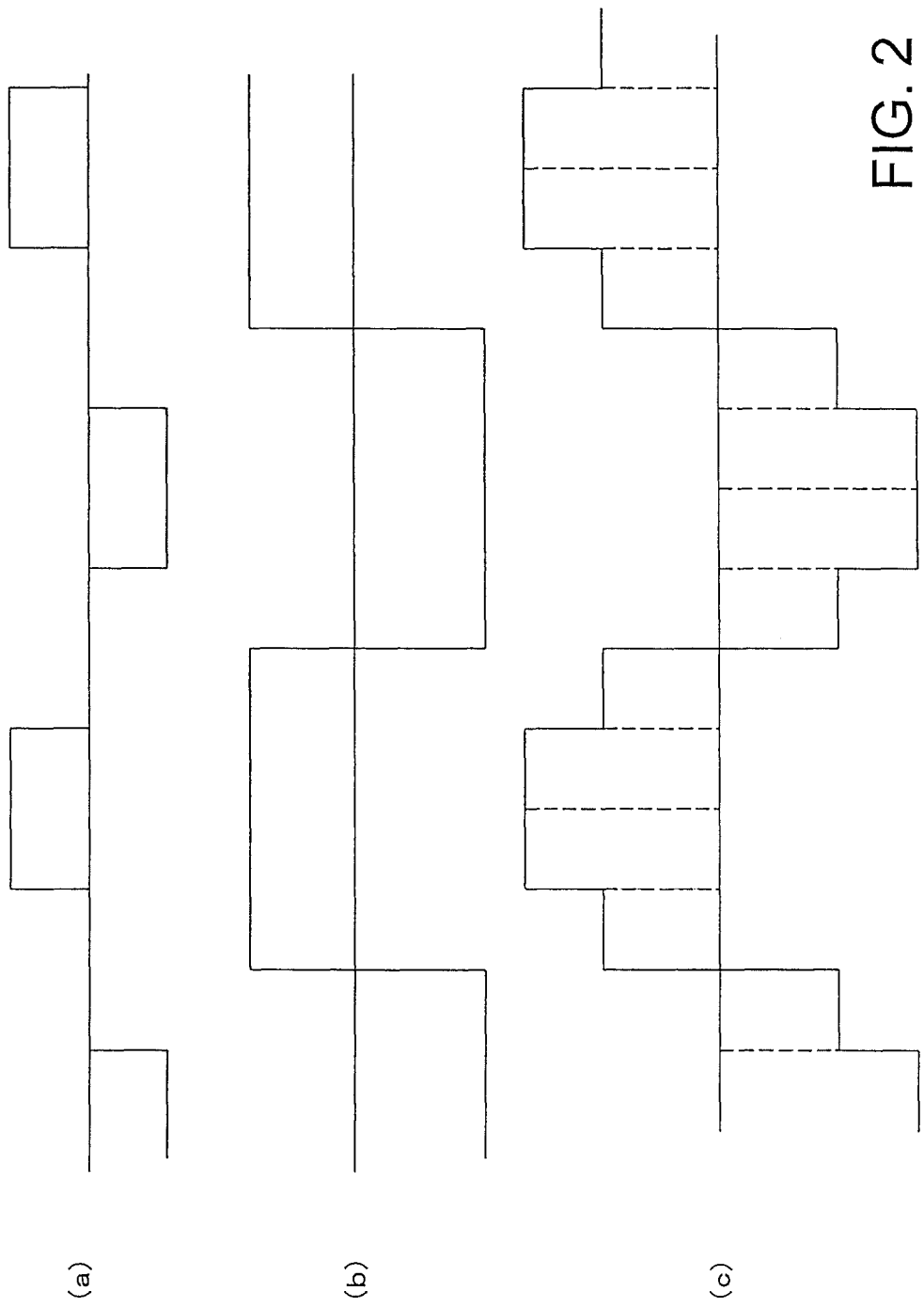
FIG. 2 is a view describing a waveform of a pseudo sine wave.

The pseudo sine wave generated in the pseudo sine wave generation circuit 20 will be described here. The pseudo sine wave is the one illustrated in FIG. 2(c) for instance, is not just a rectangular wave, and has a level change of two steps on one side at least. Such a pseudo sine wave is generated by composition of rectangular wave signals by a digital circuit. For instance, by adding a rectangular wave in FIG. 2(a) and a rectangular wave in FIG. 2(b) prepared using the same clock frequency, the pseudo sine wave with a two-step level change on one side in FIG. 2(c) is generated. Digital data obtained by such a logical operation may be supplied to the IF amplifier 12 as an analog pseudo sine wave by a DAC.

<Adjustment of F0>

In F0 adjustment of the IF filter 14, the switch 22 is switched, and the pseudo sine wave generated in the pseudo sine wave generation circuit 20 is inputted to the IF amplifier 12 and the F0 adjustment circuit 24. In the F0 adjustment circuit 24, phases are compared with the output of the IF filter 14, and the center frequency F0 of the IF filter 14 is adjusted on the basis of the comparison.

Figure 3:
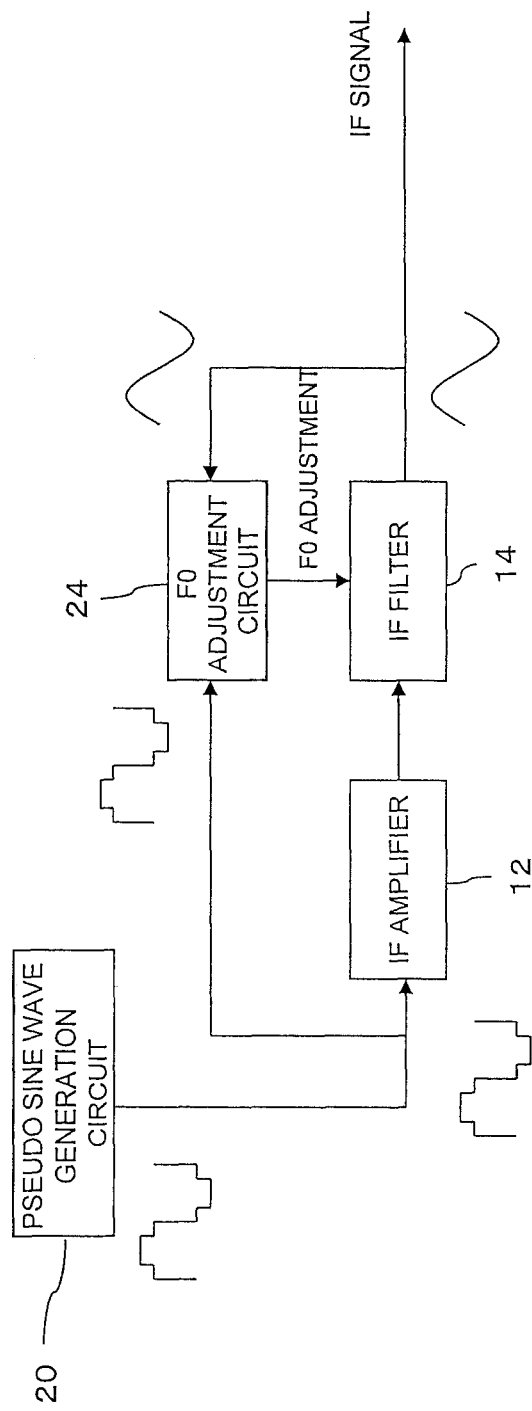
FIG. 3 is a conceptual diagram illustrating F0 adjustment.

A conceptual diagram for adjustment of the center frequency F0 of the IF filter 14 is illustrated in FIG. 3. A mode of inputting the RF signal is switched to a mode of inputting the pseudo sine wave by the switch 22. Thus, the pseudo sine wave is inputted to the IF amplifier 12. As a result, for the output of the IF filter 14, the signal which passes through the IF amplifier 12 and the IF filter 14 is outputted. For the signal, a change part is made dull by filtering and the signal is turned to a waveform close to a sine wave.

Then, the pseudo sine wave and the output signal of the IF filter 14 are inputted to the F0 adjustment circuit 24. The F0 adjustment circuit 24 adjusts the bandpass center frequency F0 of the IF filter 14.

Figure 4:
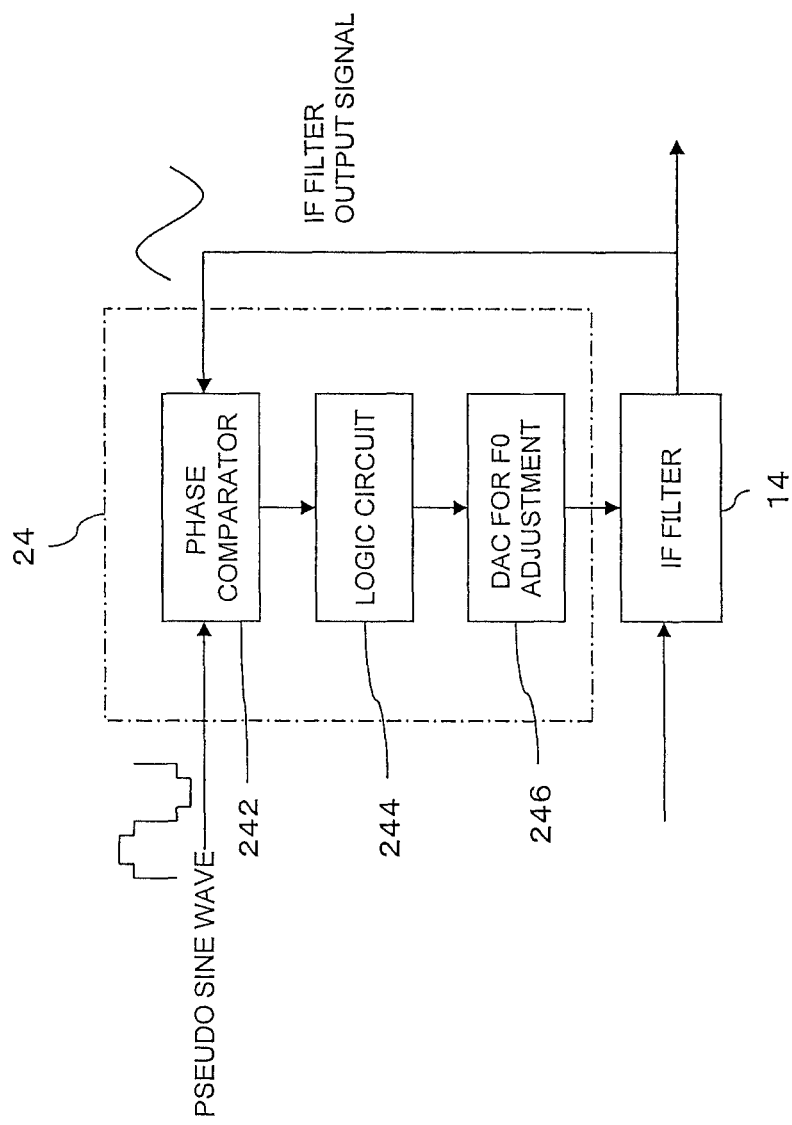
FIG. 4 is a view illustrating a configuration of an F0 adjustment circuit.

A configuration example of the F0 adjustment circuit 24 is illustrated in FIG. 4. In this example, the F0 adjustment circuit 24 includes a phase comparator 242, a logic circuit 244, and a DAC 246 for F0 adjustment. Then, the pseudo sine wave to be a reference and an output signal after passing through the IF filter are inputted to the phase comparator 242, and phases of both are compared there. That is, when frequencies of both signals are the same, the phases should be coincident, and a signal for the phase comparison result is supplied to the logic circuit 244. The logic circuit 244 rewrites the DAC 246 for F0 adjustment on the basis of the phase comparison result (phase shift). Thus, the DAC 246 for the F0 adjustment circuit supplies the F0 adjustment signal according to a rewritten value to the IF filter 14. Thus, according to the phase comparison result, the center frequency F0 of the IF filter is changed. The adjustment is repeated to drive the center frequency F0 of the IF filter 14 to be an optimum value, and the center frequency F0 of the IF filter 14 can be set to the optimum value finally.

While such an F0 adjustment operation may be performed in a plant before shipping, it may be also performed every time power is turned on, readjustment may be made at desired timing on the basis of environmental information on temperature or the like, or readjustment may be made periodically. Also, final output of the DAC 246 for F0 adjustment is preferably written in a nonvolatile memory such as an EEPROM. Then, preferably, a value stored in the nonvolatile memory is supplied to the DAC for F0 adjustment normally and the value in the nonvolatile memory is rewritten when the above-described adjustment operation is performed.

Here, the pseudo sine wave generated in the pseudo sine wave generation circuit 20 is the one illustrated in FIG. 2(c) for instance. It is not just a rectangular wave, and has a level change of two steps on one side at least. By using such a pseudo sine wave, a harmonic of a prescribed order is offset and the harmonic can be suppressed. When the rectangular wave is used, the harmonic becomes relatively large and thus an IF frequency tends to fluctuate. On the other hand, by using the pseudo sine wave, accurate F0 adjustment can be made. Also, the number of levels may be increased further to be close to the sine wave preferably, but the waveform in FIG. 2(c) is preferable in terms of easiness of generation.

<Adjustment of S Meter>

In detection level adjustment of the S meter 16 as well, the generated pseudo sine wave is inputted to a signal processing route.

Figure 5:
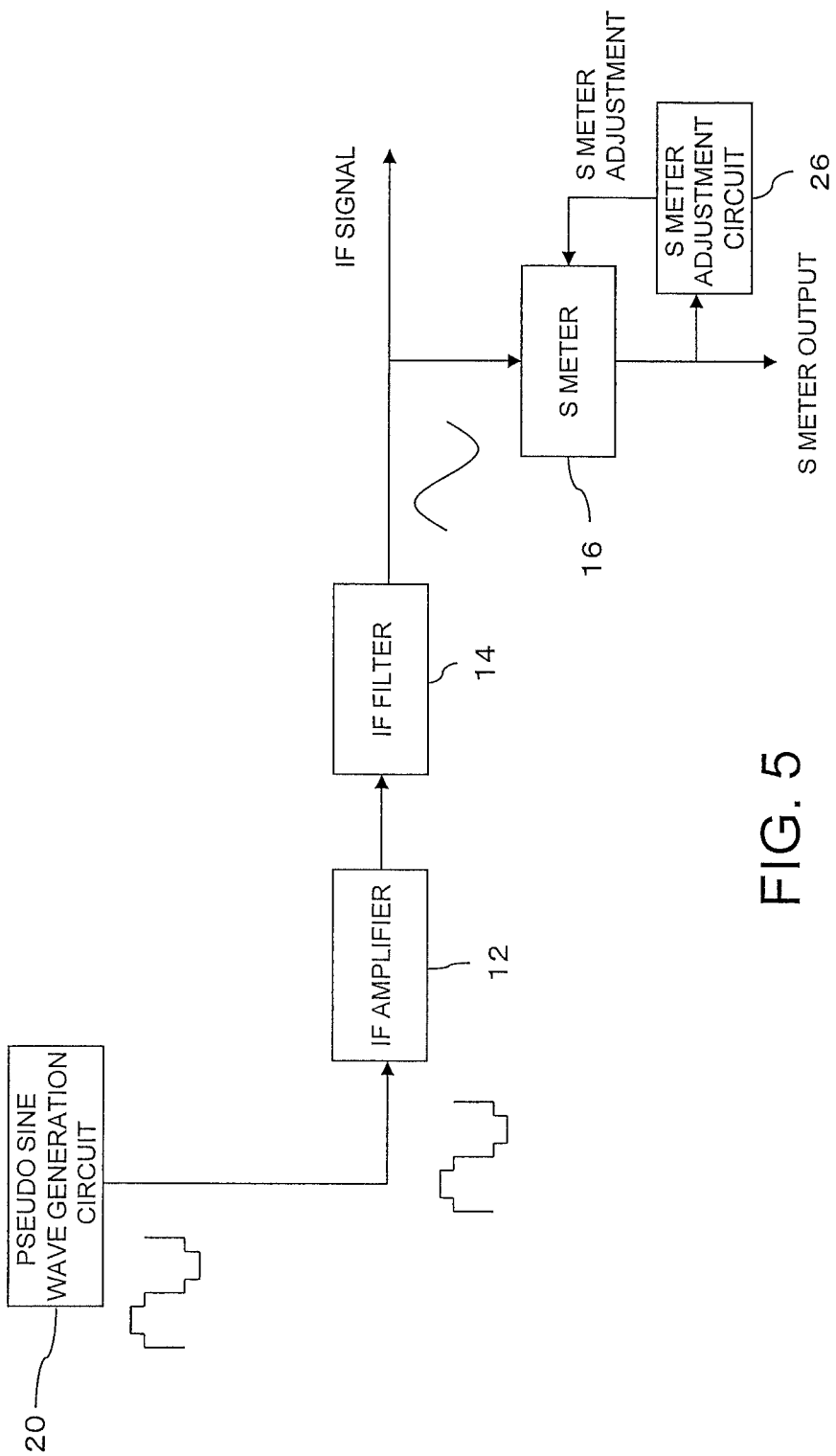
FIG. 5 is a conceptual diagram illustrating S meter adjustment.

A conceptual diagram for the detection level adjustment of the S meter 16 is illustrated in FIG. 5. First, the switch 22 is switched, and a mode of receiving the RF signal is switched to a mode of inputting the pseudo sine wave from the pseudo sine wave generation circuit 20 to the IF amplifier 12. Thus, the pseudo sine wave is inputted to the IF amplifier 12, and the signal for which the output is filtered in the IF filter 14 is obtained.

The signal after filtering is inputted to the S meter 16, and a result of the level detection of the signal after passing through the IF filter 14 is outputted. For the pseudo sine wave, the signal level thereof is recognized beforehand. Then, the S meter adjustment circuit 26 adds adjustment such that the result of the level detection at the time becomes a certain fixed value.

Figure 6:
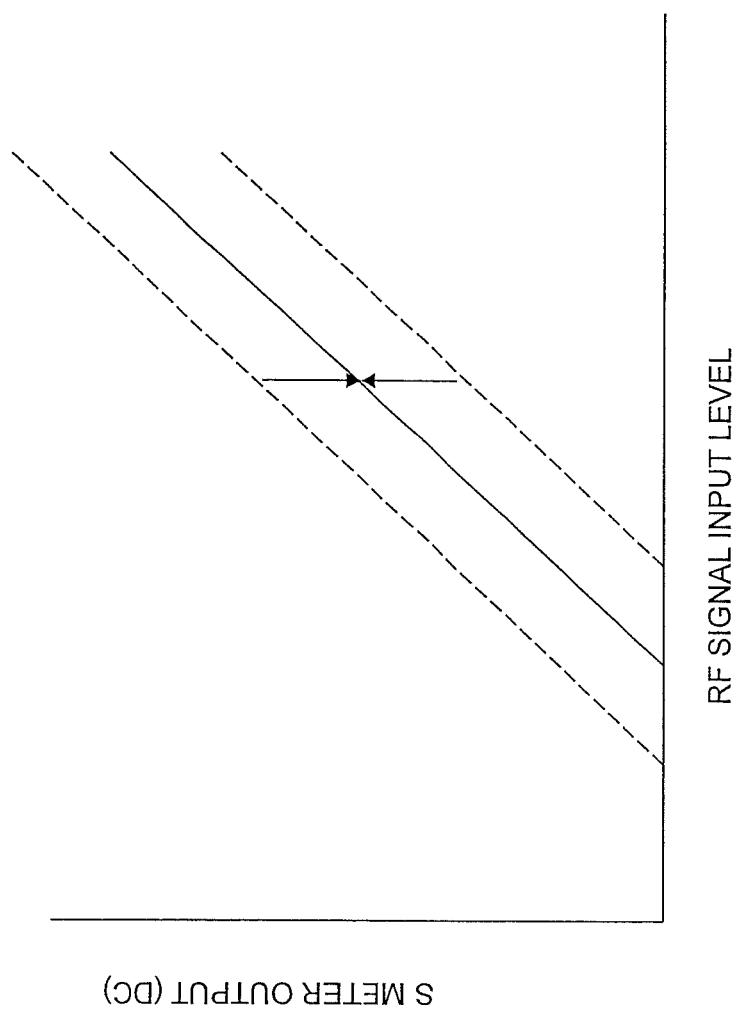
FIG. 6 is a view describing detection level characteristics of an S meter.

For instance, it is assumed that a characteristic indicated by a solid line in FIG. 6 is a correct characteristic. When a characteristic in the case of inputting the pseudo sine wave is a characteristic indicated by a broken line, the S meter adjustment circuit 26 generates the meter adjustment signal so as to turn it to the characteristic indicated by the solid line.

While such an adjustment operation of the S meter may be performed in a plant before shipping, it may be also performed every time power is turned on, readjustment may be made at desired timing on the basis of environmental information on temperature or the like, or readjustment may be made periodically. Also, preferably, final output of the S meter adjustment circuit 26 is written in a nonvolatile memory such as an EEPROM, a value stored in the nonvolatile memory is used normally, and the value is rewritten when the above-described adjustment operation is performed.

In such a manner, according to the present embodiment, as described above, the F0 adjustment of the IF filter 14 and the detection level adjustment of the S meter 16 can be made.

In the F0 adjustment of the IF filter 14, compared to a conventional indirect adjustment method using a replica oscillation circuit, by making the signal pass through the actual IF filter 14 and performing adjustment work, accuracy can be improved.

Also, in the adjustment of the detection level of the S meter 16, by adjusting the level detection of the S meter 16 by an internally generated signal, dispersion of the S meter 16 is adjusted without input of an external signal and dispersion of the S meter output is reduced.

10 Mixer, 12 Amplifier, 14 IF filter, 16 S meter, 20 Pseudo sine wave generation circuit, 22 Switch, 24 F0 adjustment circuit, 26 S meter adjustment circuit, 242 Phase comparator, 244 Logic circuit, 246 DAC for F0 adjustment.

What is claimed is:

1. A tuner which down-converts an RF signal to an IF signal and performs signal processing, comprising:
an IF filter which filters a down-converted signal centering around a center frequency F0 to take out the IF signal;
a pseudo sine wave generation circuit which generates a pseudo sine wave having a level change of at least two steps respectively on both positive and negative sides;
a switch circuit which supplies the pseudo sine wave to the IF filter instead of the RF signal; and
an F0 adjustment circuit which adjusts the center frequency F0 of the IF filter,
wherein
the pseudo sine wave is made to pass through the IF filter by the switch circuit, and
in this state, the F0 adjustment circuit compares a phase of the pseudo sine wave with a phase of the signal after passing through the IF filter and adjusts the center frequency F0 in the IF filter according to an obtained comparison result.

2. The tuner according to claim 1, wherein
the pseudo sine wave generated in the pseudo sine wave generation circuit has a level change of two steps respectively on both positive and negative sides.

3. The tuner according to claim 2, wherein
the pseudo sine wave generation circuit generates two rectangular waves that have a one-step level change on both positive and negative sides, and adds the two rectangular waves to generate the pseudo sine wave having a level change of two steps respectively on both positive and negative sides.

4. The tuner according to claim 3, wherein
the F0 adjustment circuit includes a phase comparator, and
the phase comparator compares the phase of the pseudo sine wave with the phase of the signal after passing through the IF filter.

5. The tuner according to claim 4, wherein
the F0 adjustment circuit includes a logic circuit and a DAC (digital/analog converter) for F0 adjustment,
the logic circuit receives a signal of a comparison result from the phase comparator and rewrites data inside the DAC for F0 adjustment on the basis of the comparison result, and
the DAC for F0 adjustment supplies the signal based on the rewritten data to the IF filter to change the center frequency of the IF filter.

6. The tuner according to claim 2, wherein
the F0 adjustment circuit includes a phase comparator, and
the phase comparator compares the phase of the pseudo sine wave with the phase of the signal after passing through the IF filter.

7. The tuner according to claim 6, wherein
the F0 adjustment circuit includes a logic circuit and a DAC (digital/analog converter) for F0 adjustment,
the logic circuit receives a signal of a comparison result from the phase comparator and rewrites data inside the DAC for F0 adjustment on the basis of the comparison result, and
the DAC for F0 adjustment supplies the signal based on the rewritten data to the IF filter to change the center frequency of the IF filter.

8. The tuner according to claim 1, wherein
the F0 adjustment circuit includes a phase comparator, and
the phase comparator compares the phase of the pseudo sine wave with the phase of the signal after passing through the IF filter.

9. The tuner according to claim 8, wherein
the F0 adjustment circuit includes a logic circuit and a DAC (digital/analog converter) for F0 adjustment,
the logic circuit receives a signal of a comparison result from the phase comparator and rewrites data inside the DAC for F0 adjustment on the basis of the comparison result, and
the DAC for F0 adjustment supplies the signal based on the rewritten data to the IF filter to change the center frequency of the IF filter.

10. The tuner according to claim 1, further comprising:
an S meter which detects a signal level of an IF signal that is output of the IF filter; and
an S meter adjustment circuit which adjusts output of the S meter,
wherein
the pseudo sine wave is made to pass through the IF filter by the switch circuit, and
in this state, a detection level of the S meter is adjusted depending on a level of an output signal of the S meter circuit.

11. An adjustment method of an IF filter, comprising:
generating a pseudo sine wave having a level change of at least two steps respectively on both positive and negative sides;
operating a switch which selects either one of an RF signal and the pseudo sine wave to select the pseudo sine wave;
down-converting the pseudo sine wave;
filtering the down-converted signal centering around a center frequency F0 by the IF filter to take out an IF signal; and
comparing a phase of the taken-out IF signal and a phase of the pseudo sine wave and adjusting the center frequency F0 in the IF filter according to an obtained comparison result.

12. The method according to claim 11, wherein
the pseudo sine wave has a level change of two steps respectively on both positive and negative sides.

13. The method according to claim 12, wherein
the pseudo sine wave is generated by adding two rectangular waves that have a one-step level change on both positive and negative sides.

14. The method according to claim 13, further comprising:
rewriting data inside a DAC for F0 adjustment on the basis of the comparison result; and the DAC for F0 adjustment supplying a signal based on the rewritten data to the IF filter to change the center frequency of the IF filter.

15. The method according to claim 12, further comprising:
rewriting data inside a DAC for F0 adjustment on the basis of the comparison result; and
the DAC for F0 adjustment supplying a signal based on the rewritten data to the IF filter to change the center frequency of the IF filter.

16. The method according to claim 11, further comprising:
rewriting data inside a DAC for F0 adjustment on the basis of the comparison result; and
the DAC for F0 adjustment supplying a signal based on the rewritten data to the IF filter to change the center frequency of the IF filter.

17. The method according to claim 11, further comprising:
in the state of making the pseudo sine wave pass through the IF filter by the switch circuit, detecting a signal level of the IF signal that is output of the IF filter by an S meter circuit; and
adjusting a detection level of the S meter depending on a level of an output signal of the S meter circuit.

18. The tuner according to claim 17, wherein
the S meter adjustment circuit adjusts the detection level of the S meter to a prescribed value.

19. A tuner which down-converts an RF signal to an IF signal and performs signal processing, comprising:
an IF filter which filters a down-converted signal centering around a center frequency F0 to take out the IF signal;
an S meter which detects a signal level of the IF signal that is output of the IF filter;
an S meter adjustment circuit which adjusts output of the S meter;
a pseudo sine wave generation circuit which generates a pseudo sine wave having a level change of at least two steps respectively on both positive and negative sides; and
a switch circuit which supplies the pseudo sine wave to the IF filter instead of the RF signal,
wherein
the pseudo sine wave is made to pass through the IF filter by the switch circuit, and
in this state, a detection level of the S meter is adjusted depending on a level of an output signal of the S meter circuit.

20. The tuner according to claim 19, wherein
the pseudo sine wave generated in the pseudo sine wave generation circuit has a level change of two steps respectively on both positive and negative sides, and
the pseudo sine wave generation circuit generates two rectangular waves that have a one-step level change on both positive and negative sides, and adds the two rectangular waves to generate the pseudo sine wave having a level change of two steps respectively on both positive and negative sides.

* * * * *